(12) United States Patent
Ogo

(10) Patent No.: US 10,475,684 B2
(45) Date of Patent: Nov. 12, 2019

(54) SUPPORTING DEVICE AND SUPPORTING METHOD FOR ARTICLES

(71) Applicant: MURATA MACHINERY, LTD., Kyoto-shi, Kyoto (JP)

(72) Inventor: Haruki Ogo, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 136 days.

(21) Appl. No.: 15/555,602

(22) PCT Filed: Feb. 5, 2016

(86) PCT No.: PCT/JP2016/053490
§ 371 (c)(1),
(2) Date: Sep. 5, 2017

(87) PCT Pub. No.: WO2016/152276
PCT Pub. Date: Sep. 29, 2016

(65) Prior Publication Data
US 2018/0047591 A1    Feb. 15, 2018

(30) Foreign Application Priority Data

Mar. 26, 2015    (JP) .................. 2015-063643

(51) Int. Cl.
*H01L 21/67* (2006.01)
*H01L 21/677* (2006.01)
*H01L 21/68* (2006.01)
*H01L 21/673* (2006.01)

(52) U.S. Cl.
CPC ............ *H01L 21/677* (2013.01); *H01L 21/68* (2013.01); *H01L 21/6735* (2013.01)

(58) Field of Classification Search
CPC .................................................... H01L 21/673
See application file for complete search history.

(56) References Cited

U.S. PATENT DOCUMENTS 6,612,797 B1 * 9/2003 Bonora ............... G03F 7/70541
414/217
2012/0128455 A1 * 5/2012 Tsubaki .............. H01L 21/6773
414/293

FOREIGN PATENT DOCUMENTS

JP    4543567 B2    9/2010

* cited by examiner

*Primary Examiner* — Ronald P Jarrett
(74) *Attorney, Agent, or Firm* — Keating & Bennett, LLP

(57) ABSTRACT

A supporting device includes a supporting member including a first positioning member positioning a bottom of a first article and inhibiting horizontal movement of the first article, and a second positioning member positioning a bottom of a second article and inhibiting horizontal movement of the second article. The first and second positioning members release the articles when elevated. The supporting device includes a first anti-drop member preventing the first article from being elevated and released and a second anti-drop member preventing the second article from being elevated and released. The first positioning member is higher than the second positioning member. The end of the first article closer to the first and second anti-drop members is nearer or equally distant to the first and second anti-drop members than a corresponding end of the second article. The second anti-drop member is retracted from the end of the first article when the first positioning member positions the first article.

9 Claims, 9 Drawing Sheets

F I G. 3
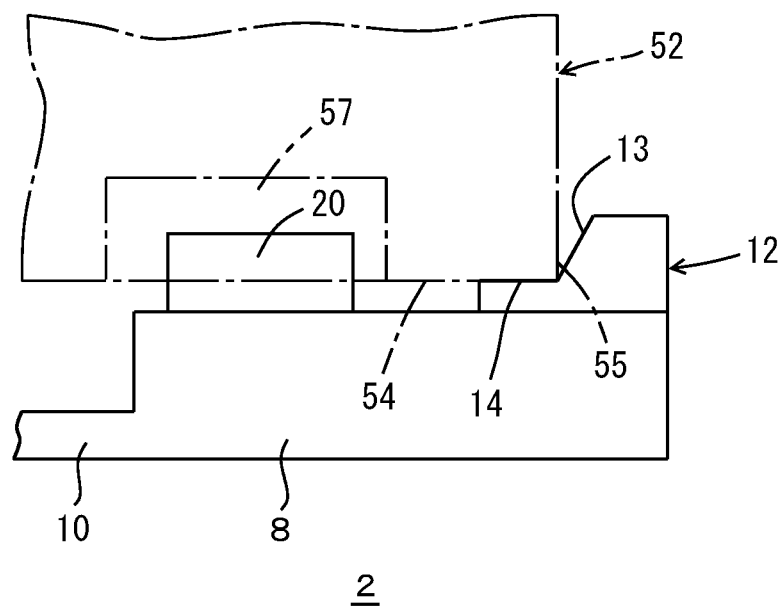

F I G. 6
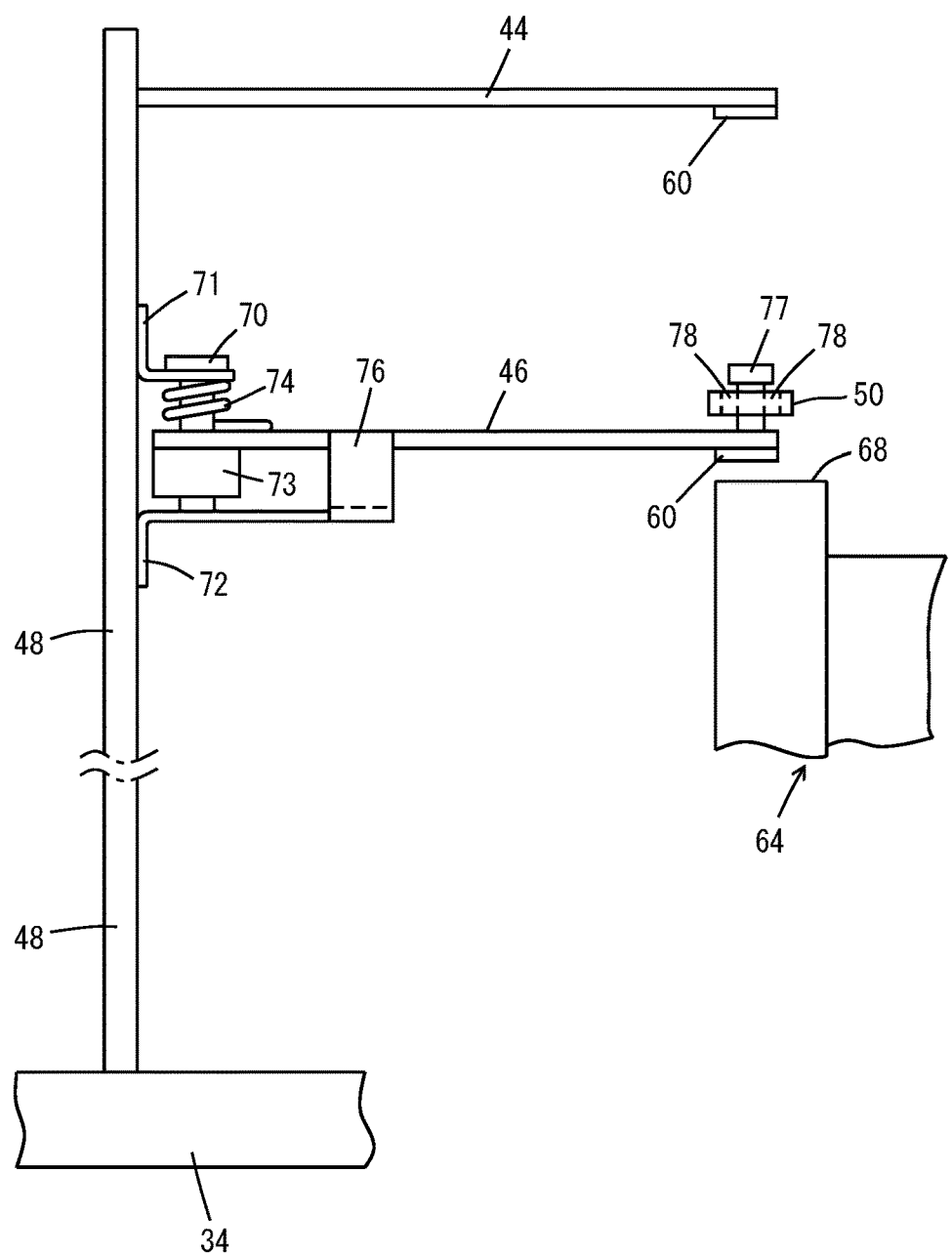

F I G. 8
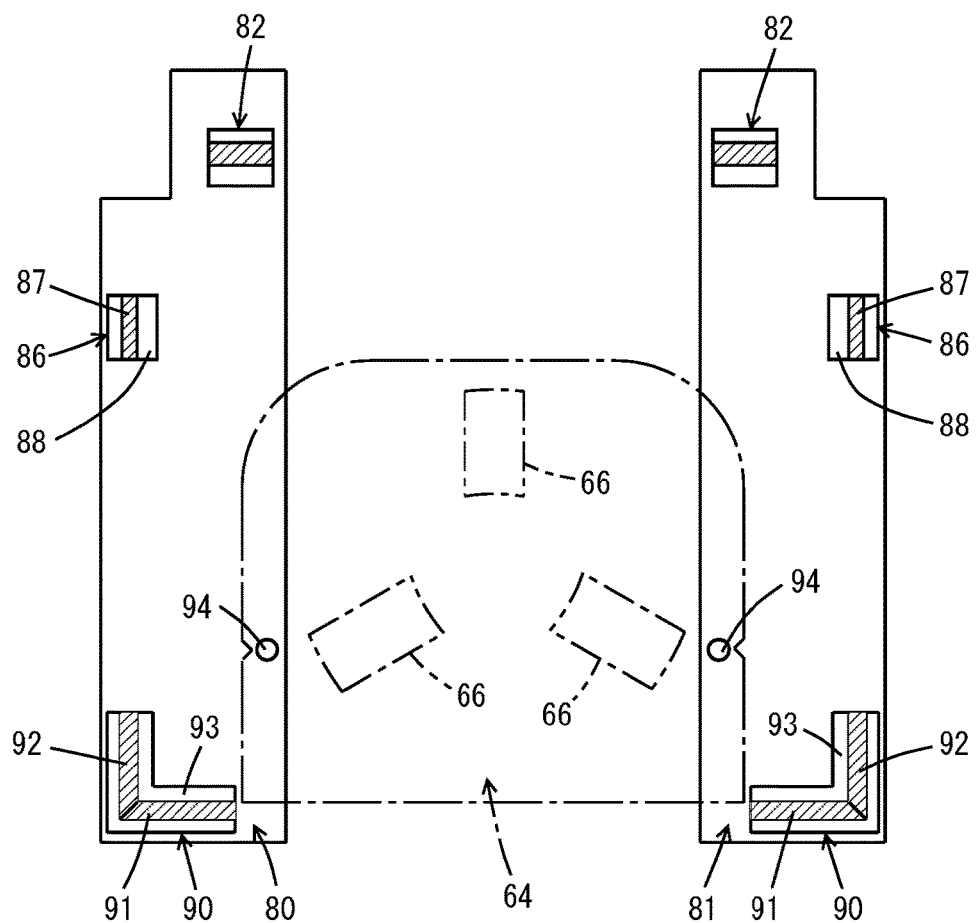

Comparative Example

SUPPORTING DEVICE AND SUPPORTING METHOD FOR ARTICLES

BACKGROUND OF THE INVENTION

1. Field of the Invention

The present invention relates to a supporting device for articles and a supporting method.

2. Description of the Related Art

JP4543567B discloses a SCARA arm provided with an anti-drop member. The anti-drop member is attached to an arm of the SCARA arm and advances over a FOUP, the object to be transferred, to prevent it from dropping. It has been required to support two species of articles having different heights such as FOUPs for 300 mm wafers and FOUPs for 450 mm wafers. However, the SCARA arm of JP4543567B is not suitable for supporting both of the two species of articles and preventing their dropping.

SUMMARY OF THE INVENTION

Preferred embodiments of the present invention provide plural species of articles which have different heights, to prevent them from dropping and tumbling, and prevent the taller article from hindering prevention of the lower article from dropping.

A supporting device according to a preferred embodiment of the present invention supports a first article and a second article which is lower than the first article in height, the supporting device including a supporting member, a first positioning member that positions a bottom of the first article and inhibits horizontal movement of the first article; and a second positioning member that positions a bottom of the second article and inhibits horizontal movement of the second article, wherein the first positioning member and the second positioning member position the first article and the second article respectively when lowered on the supporting member and release the first article and the second article respectively from positioning when elevated therefrom, the supporting device further includes a first anti-drop member that advances over the first article when the first article is positioned by the first positioning member and prevents the first article from elevating and escaping from positioning; and a second anti-drop member that advances over the second article when the second article is positioned by the second positioning member and prevents the second article from elevating and escaping from positioning, wherein the first positioning member is provided at a higher position than the second positioning member, the first anti-drop member and the second anti-drop member are provided at a same side of the supporting member in plan view, the first positioning member and the second positioning member position one end of the first article that is on a side of the first anti-drop member and the second anti-drop member nearer or equally distant to the first anti-drop member and the second anti-drop member than one end of the second article that is on the side of the first anti-drop member and the second anti-drop member, and the second anti-drop member retracts from the one end of the first article when the first positioning member positions the first article.

A supporting method according to a preferred embodiment of the present invention supports a first article and a second article which is lower than the first article in height by a supporting device, and the method includes positioning a bottom of the first article and inhibiting horizontal movement of the first article by a first positioning member of a supporting member of the supporting device and releasing the first article from positioning when the first article is elevated; positioning a bottom of the second article and inhibiting horizontal movement of the second article by a second positioning member of a supporting member of the supporting device and releasing the second article from positioning when the second article is elevated; advancing a first anti-drop member over the first article, when the first positioning member positions the first article, so as to prevent the first article from elevating and being released from positioning; advancing a second anti-drop member over the second article, when the second positioning member positions the second article, so as to prevent the second article from elevating and being released from positioning; wherein the first positioning member is provided at a higher position than the second positioning member is, the first anti-drop member and the second anti-drop member are provided at a same side of the supporting member in plan view, the first positioning member and the second positioning member position one end of the first article that is on a side of the first anti-drop member and the second anti-drop member nearer or equally distant to the first anti-drop member and the second anti-drop member than one end of the second article that is on the side of the first anti-drop member and the second anti-drop member, and retracting the second anti-drop member from the one end of the first article, when the first positioning member positions the first article. These steps may be carried out, for example, in parallel or simultaneously. In this specification, descriptions about the supporting device apply to the supporting method as they are.

In a preferred embodiment of the present invention, the first and the second positioning members position and support the bottoms of the first and the second articles, however, the bottoms of the first and second articles may be supported by another supporting member. In plan view, the first anti-drop member and the second anti-drop member are on the same side of the supporting member. Further, the end of the first article on the side of the first and second anti-drop members is positioned at the same position to or at a nearer position than the nearest end of the second article from the first and second anti-drop members.

Since the first article and the second article are released from the positioning, when they are lifted from the supporting member, they might drop or tumble. Therefore, the first anti-drop member and the second anti-drop member occupy a higher space over these articles and prevent the articles from elevating and being released from the positioning. Since the end of the first article is positioned at the same position to or at a nearer position than the end of the second article from the first and the second anti-drop members, the second anti-drop member may interfere with the taller first article. Therefore, when the first positioning member positions the first article, the second anti-drop member is made to retract from the end of the first article.

According to various preferred embodiments of the present invention, two species of articles which have different heights are positioned, the first anti-drop member prevents the first article from dropping and tumbling, and the second anti-drop member prevents the second article from dropping and tumbling. Further, since the second anti-drop member is retractable, the first article does not hinder the provision of the second anti-drop member. According to preferred embodiments of the present invention, dropping and tumbling of articles are prevented, however, they may be simply referred to as prevention of dropping without reference to tumbling.

Preferably, the second anti-drop member advances over the second article and retracts from the end of the first article when pushed by the first article, and an energizing member that energizes the second anti-drop member to advance over the second article is further provided. According to this configuration, the second anti-drop member advances over the second article without any driving mechanism and retracts when pushed by the first article. Therefore, a space for the driving mechanism is not needed, and the maintenance for the driving mechanism is also not needed.

Further preferably, a moving member that advances the supporting member to an advanced position to transfer the first article and the second article between a counterpart of transfer and retracts the supporting member to a position of origin is provided; the first anti-drop member and the second anti-drop member are both provided at the moving member and, at the advanced position, the first anti-drop member and the second anti-drop member are both positionally separated from the first article and the second article and, at the position of origin, the first anti-drop member advances over the first article and the second article, and the second anti-drop member advances only over the second article. According to this configuration, the supporting device is integrated in a transfer apparatus for articles, and the first anti-drop member and the second anti-drop member move between positions over the articles and positions separated from the articles by the movements of the moving member. Further, the second anti-drop member advances and retracts in response to being energized by the energizing member and the pushing force exerted by the first article, in addition to the movement of the moving member.

Preferably, the first anti-drop member and the second anti-drop member are attached to a common pillar at a higher position and at a lower position, respectively, and the second anti-drop member is rotatably attached around a vertical shaft to the pillar. Since the second anti-drop member rotates around the vertical shaft, a smaller space is used for the advancement and retraction, in comparison with horizontal advancement and retraction.

Further preferably, the second anti-drop member is provided with a roller that contacts the end of the first article. According to this configuration, the second anti-drop member contacts with the first article gently, and, for example, particle generation due to the contact is decreased.

Particularly preferably, a stopper that restricts the range of rotation of the second anti-drop member is provided to halt the second anti-drop member at a position over the second article. According to this configuration, the second anti-drop member is energized by the energizing member, positioned by the stopper, and advances reliably over the second article.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a partially enlarged side view of FIG. 2 indicating positioning of the first article by a positioning protrusion.

FIG. 6 is a partially enlarged side view of FIG. 5 indicating an anti-drop mechanism.

FIG. 8 is a plan view of cell supports which support the second article.

DETAILED DESCRIPTION OF THE PREFERRED EMBODIMENTS

Preferred embodiments of the present invention will be described in the following.

Figure 7:
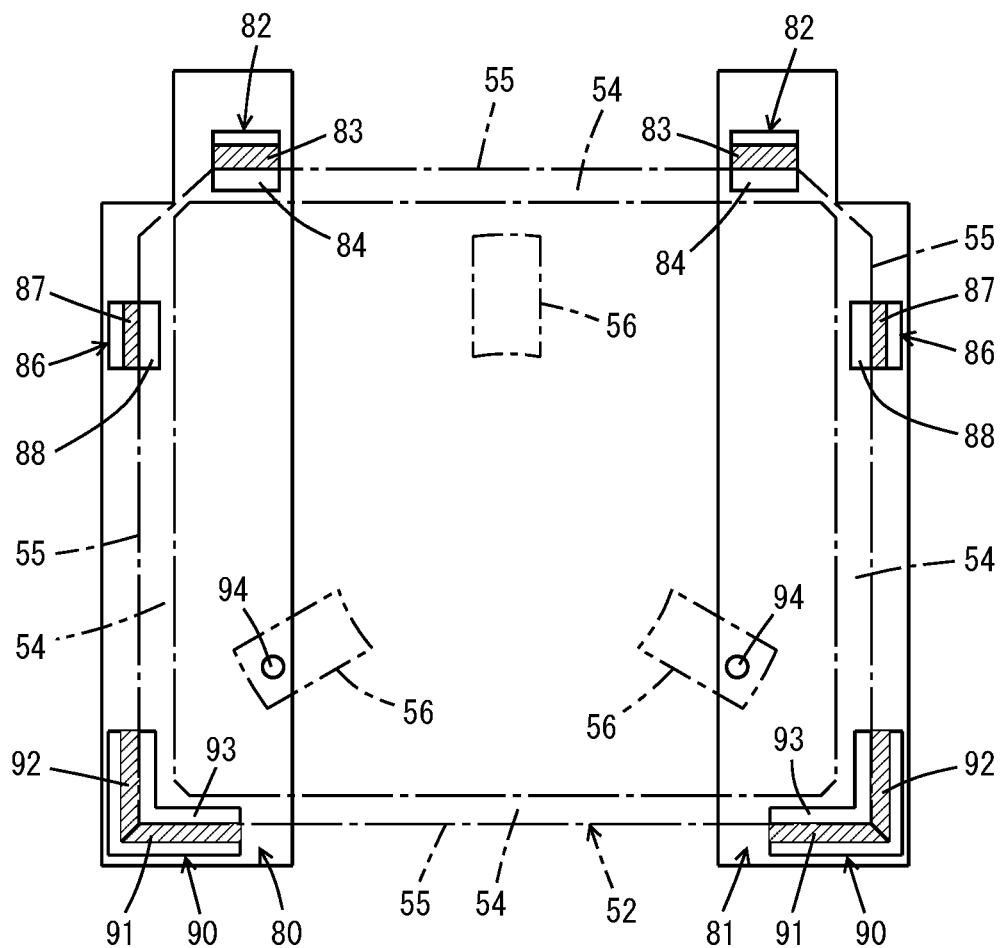
FIG. 7 is a plan view of cell supports which support the first article.

FIGS. 1-6 show a SCARA arm 4 according to a preferred embodiment of the present invention. The SCARA arm 4 includes a hand 2 (supporting member) that positions and supports articles and includes arms 32, 34 that transfer articles with the advancement and retraction thereof from and to the counterparts of transfer such as cell supports 80, 81. Further, FIGS. 7, 8 show the cell supports 80, 81 to and from which the SCARA arm transfers articles.

Two species of articles including a FOUP 52 for 450 mm wafers (the first article) and a FOUP 64 for 300 mm wafers (the second article) are dealt with, for example. However, any kind of articles may be dealt with. The second article is smaller than the first article in size and lower than the first article in height. In the drawings, chain lines show the FOUPs 52, 64, and their portions irrelevant to descriptions of preferred embodiments of the present invention, such as side flanges of the FOUPs 52, 64, are omitted. FIGS. 1, 4, 7, and 8 show the bottom structures of the FOUPs 52, 64 that are positioned by the hand 2 and the cell supports 80, 81.

Figure 1:
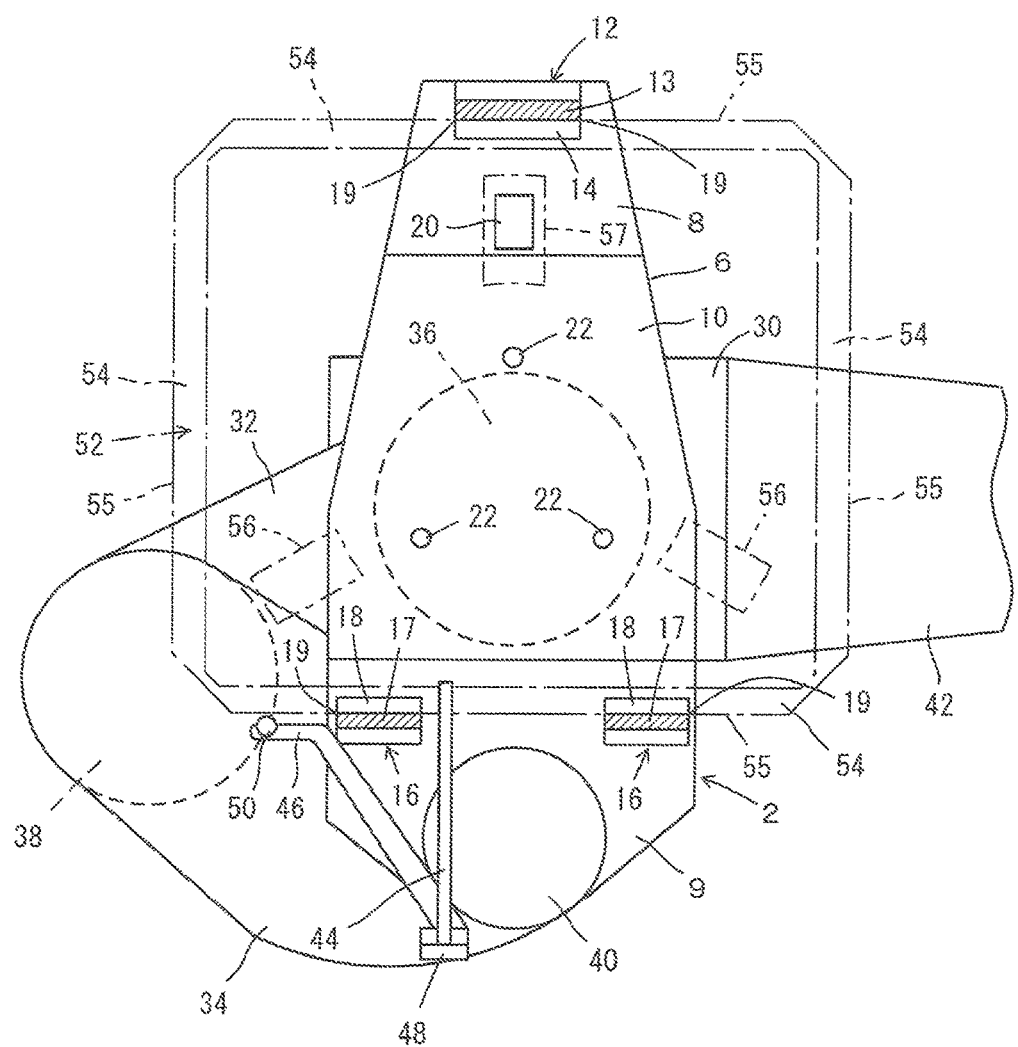
FIG. 1 is a plan view wherein a SCARA arm that is equipped with a supporting device according to a preferred embodiment of the present invention supports a first article (e.g., a FOUP for 450 mm wafer).
Figure 2:
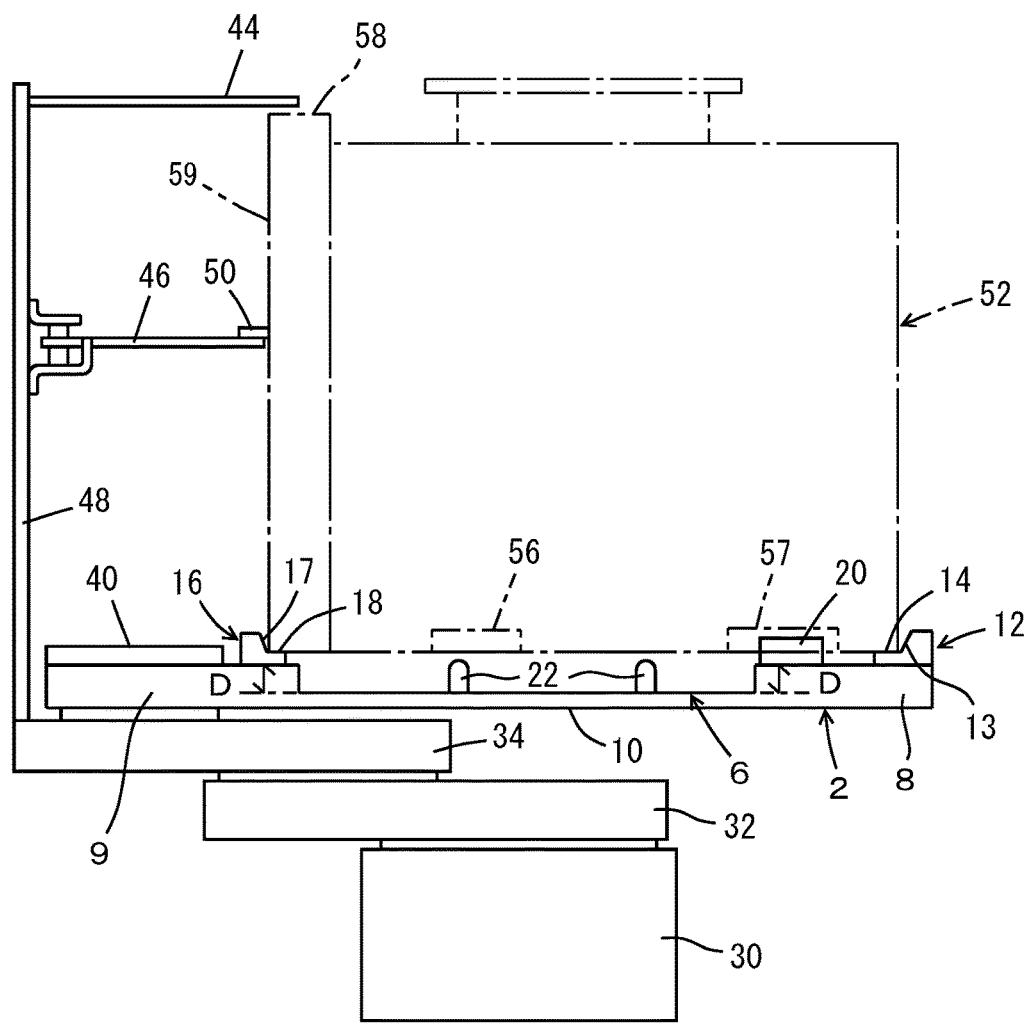
FIG. 2 is a side view wherein the SCARA arm supports the first article.

FIGS. 1, 2 show the SCARA arm 4 which supports the FOUP 52 for 450 mm wafers, for example. The hand 2 is provided with a plate 6 that includes thick portions 8, 9 at both the tip end and the base end, along the front and rear direction of the plate, and a thin portion 10 between them. The thick portion at the base end 9 is attached to a shaft 40 which rotates the hand 2. In the specification, an end of the hand 2 closer to the shaft 40 is referred to as the base end, the opposite thick portions 8 as the tip end, and the direction connecting the base and tip ends as the front and rear direction. A perpendicular or substantially perpendicular direction to the front and rear direction in a horizontal plane is referred to as a lateral direction.

The width of the plate 6 along the lateral direction is narrower than those of FOUPs 52, 64 so that the cell supports 80, 81 may support the FOUPs 52, 64. The thick portion 8 at the base end includes a positioning guide 12 at the center portion of the thick portion along the lateral direction, and the thick portion at the tip end has, for example, a pair of left and right positioning guides 16, 16. The positioning guides 12, 16 have the same structure except for their lengths and are provided with tapered surfaces 13, 17 which are inclined to be lower at the thin portion 10 and horizontal supporting surfaces 14, 18 which extend from the lower end of the tapered surfaces 13, 17 towards the thin portion 10. The outer-most points 19 of the positioning guides 12, 16 along the lateral direction, at the boundary between the tapered surfaces 13, 17 and the supporting surfaces 14, 18, define and function as the anti-rotation elements of the FOUP 52.

The thick portion 8 includes, for example in plan view, a rectangular or substantially rectangular positioning protrusion 20 at a position closer to the thin portion 10 and at the center portion of the thick portion along the lateral direction, and the positioning protrusion has R-shaped portions at the lateral edges. The thin portion 10 is provided with, for example, three kinematic coupling pins 22 (hereinafter referred to as pins 22), and the height of the pins 22 is lower than that of the supporting surfaces 14, 18. The upper surface of the thin portion 10 is lower than the upper surface of the thick portion 8 by D, and therefore, there are differences in the thickness D between the thick portions 8, 9 and the thin portion 10. Further, since the upper surface of the thin portion 10 is lower than the upper surface of the thick portion 8, the heights of the positioning guides 12, 16 are low.

The SCARA arm 4 is provided with an arm 32 which rotates around a shaft 36 attached to a base 30 and also an arm 34 which rotates around a shaft 38 attached to a tip end of the arm 32, and the shaft 40 is provided at a tip end of the arm 34. The SCARA arm 4 is mounted on a carrier which is capable of rising and lowering and horizontal reciprocating. The carrier is provided in a stocker or the like to temporarily store the FOUPs 52, 64, reciprocates along a rack, and supports, raises, and lowers the SCARA arm 4 by an arm 42. The combination of advancement and retraction of the SCARA arm 4 and rising and lowering of the base 30 performs the transfer of the FOUPs 52, 34 to and from the cell supports 80, 81.

A first anti-drop member 44 and a second anti-drop member 46 are provided. The anti-drop members 44, 46 are attached to a pillar 48 which stands vertically upright from the arm 34, and have respective fixed heights. The anti-drop member 44 is attached to a position closer to the upward end of the pillar 44, and the anti-drop member 46 is attached to a lower position than the anti-drop member 44 is. The second anti-drop member 46 is attached to and rotatable, in a horizontal plane, around a shaft that is attached to the pillar 48 and has at the opposite tip end a roller 50 that rotates around a vertical axis. The first anti-drop member 44 prevents the FOUP 52 for 450 mm wafers from dropping, and the second anti-drop member 46 prevents the FOUP 64 for 300 mm wafers from dropping, for example. The anti-drop member 44 regulates the upper end position of the door 58 of the FOUP 52, and the anti-drop member 46 regulates the upper end position of the door 68 of the FOUP 64. Further, the anti-drop member 46 retracts with the roller 50 being pushed by the end surface 59 of the door 58, when in contact with the FOUP 52. The detailed structure of the anti-drop mechanism that includes the anti-drop members 44, 46 and so on will be described later with reference to FIG. 6. Further, 69 designates the end surface of the door 68 of the FOUP 64, and the end surface 59 is nearer to the pillar 48 than the end surface 69 is.

As shown in FIGS. 1 and 2, the FOUP 52 for 450 mm wafers is provided with the conveyor surfaces 54 on the four sides at the bottom. The side surfaces of the FOUP include, at their bottom ends, conveyor guide surfaces 55 which intersect with the conveyor guide surfaces 54. The conveyor surfaces 54 and the conveyor guide surfaces 55 are flat and are provided at specified positions. The FOUP 52 is provided at the bottom with three V-grooves (e.g., inversely V-shaped grooves in section), and the V-grooves closer to the door 58 are referred to as V-grooves 56, and the V-groove far from the door 58 is referred to as V-groove 57. The hand 2 positions the FOUP along the front and rear direction by the front and rear conveyor guide surfaces 55 and the positioning guides 12, 16 and supports the conveyor surfaces by the supporting surfaces 14, 18. Further, the positioning protrusion 20 positions the V-groove 57 which is opposite to the door 58 so that the FOUP is positioned along the lateral direction. Since the positioning by the positioning protrusion 20 might allow the FOUP 52 to rotate about a vertical axis, the rotation of the FOUP 52 is inhibited by the anti-rotation elements 19.

FIGS. 1-3 show how the FOUP 52 for 450 mm wafers is supported. As shown in FIG. 3, one of the conveyor guide surfaces 55 is guided by the tapered surface 13 of the positioning guide 12, and one of the conveyor surfaces 54 is supported by the supporting surface 14. Similarly, on the positioning guides 16, the tapered surfaces 17 guide one of the conveyor guide surfaces 55, and the supporting surfaces 18 support one of the conveyor surfaces 54. As a result, the FOUP 52 is positioned along the front and rear direction and is inhibited from rotation about a vertical axis by the anti-rotation elements 19. Thus, the FOUP 52 is positioned in a horizontal plane and has only one freedom of movement along the up and down direction. When large acceleration is exerted to the FOUP 52 with the movement of the SCARA arm 4 or the carrier which is provided with the SCARA arm 4, the FOUP 52 might fall or tumble. Therefore, the first anti-drop member 44 regulates the height of the FOUP 52 so as to prevent the falling and tumbling.

Figure 4:
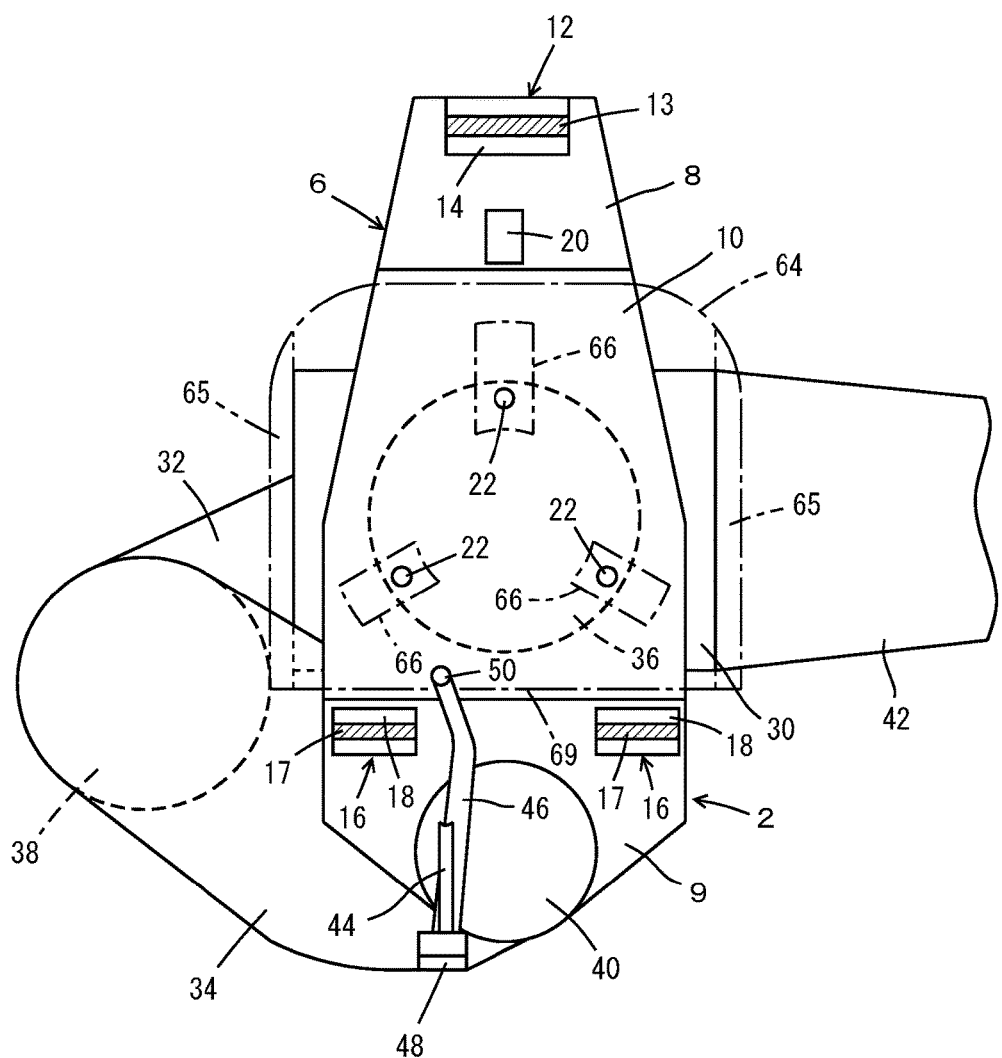
FIG. 4 is a plan view wherein the SCARA arm supports a second article (e.g., a FOUP for 300 mm wafer).
Figure 5:
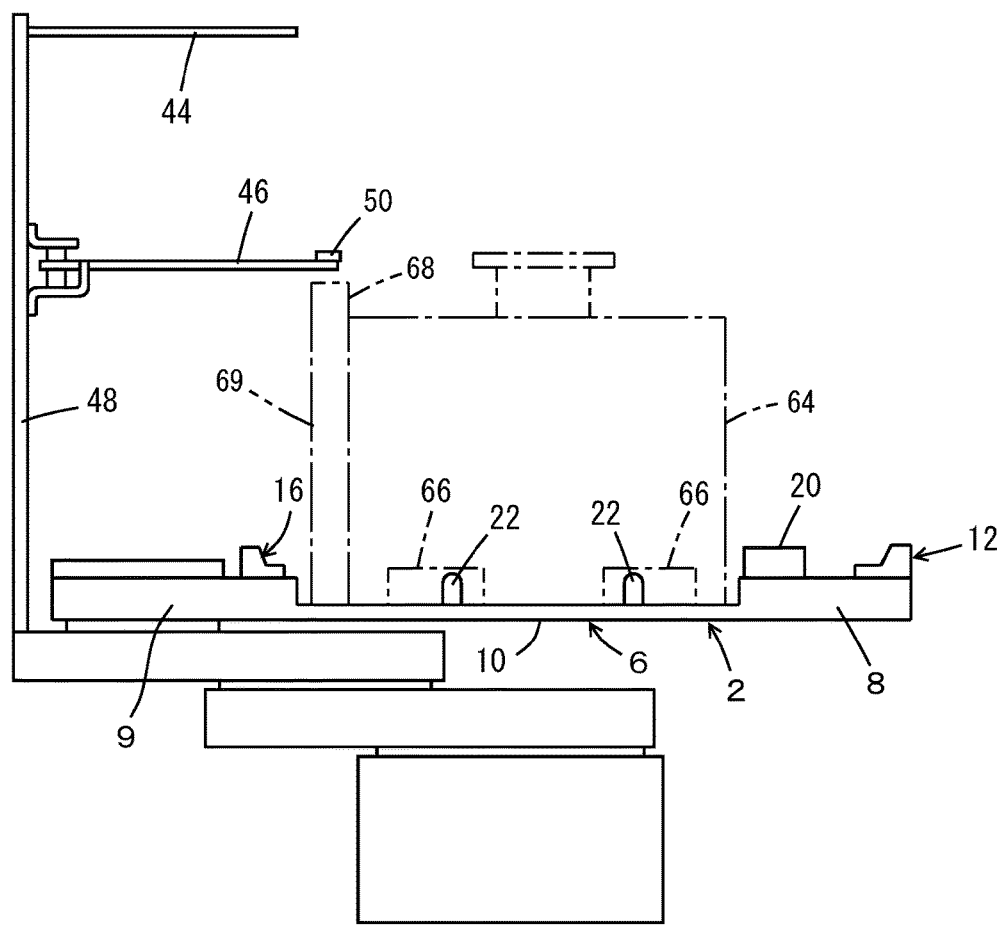
FIG. 5 is a side view wherein the SCARA arm supports the second article.

FIGS. 4 and 5 show the support of the FOUP 64 for 300 mm wafers. The thin portion 10 has a length, along the front and rear direction, longer than the length or the depth of the FOUP 64, and the FOUP 64 is supported on the thin portion 10. The FOUP 64 is positioned, according to a standard specification thereof, with the kinematic coupling between the three V grooves 66 and the three pins 22, and the conveyor surfaces 65 are not used for the positioning. Since the FOUP 64 is smaller than the FOUP 52, and since the pins 22 are provided at positions corresponding to the V-grooves 66, the standard positioning becomes possible. Further, since the pins 22 are on the thin portion 10, they do not come in contact with the bottom of the FOUP 52. Moreover, the positioning protrusion 20 is out of the bottom of the FOUP 64. Since the FOUP 64 is positioned by the pins 22 in a horizontal plane, the second anti-drop member 46 regulates the height of the FOUP 64 so as to prevent the dropping and tumbling.

As shown in FIG. 6, the pillar 48 stands on the arm 34, and, when the arms 32, 34 advance from the state shown in FIGS. 1, 4, the anti-drop members 44, 46 do not come in contact with the top portions of FOUP 52, 64. Therefore, the anti-drop members 44, 46 do not interfere with the FOUPs 52, 64. When the arms 32, 34 return to their positions of origin as shown in FIGS. 1, 4, then it becomes possible for the carrier to travel. Further, when the arms 34 return to the position of origin, the anti-drop members are moved to advance over the FOUPs 52, 64, and the anti-drop member 44 advances over the door 58 so as to prevent the FOUP 52 from dropping and tumbling. Elastic pieces 60 preferably are provided on the bottoms of the anti-drop members 44, 46 and absorb the shock due to the contact with the FOUPs 52, 64. The elastic pieces 60 may be omitted.

The anti-drop member 46 is rotatably supported around the vertical shaft 70 and is energized to advance over the FOUPs 52, 64 by an energizing member. The energizing member preferably includes brackets 71 and 72, a bearing 73, and a torsion spring 74, for example. While the elastic piece 60 is provided on the bottom of the tip end of the anti-drop member 46, for example, it may be omitted. The orientation of the anti-drop member 46 is regulated by a stopper 76 so as to advance over the door 68 of the FOUP 52. The roller 50 is supported by a bearing 78 so as to rotate about a vertical shaft 77. While the anti-drop member 46 retracts with the roller 50 being pushed by the front side of door from the FOUP 52, the anti-drop member advances over the door 68 of the FOUP 64 so as to prevent the dropping and the tumbling.

In the present preferred embodiment, the energizing member and the stopper 76 are provided so that the anti-drop member 46 advances and retracts according to the species of the FOUPs 52, 64. However a driving member, such as a solenoid or a motor, may be provided instead, in order to advance and retract the anti-drop member 46. However, this configuration makes the anti-drop mechanism larger and increases the number of portions which need maintenance.

FIG. 7 shows the support of the FOUP 52 for 450 mm wafers by the cell supports 80, 81. Each of the cell supports 80,81 is provided with a positioning guide 82 for the front and rear direction, a positioning guide for the lateral direction, and a positioning guide 90 both for the front and rear direction and lateral direction and positions the FOUP 52 along the directions of front, rear, left, and right. Tapered surfaces 83 and 91 inclined along the front and rear direction, and tapered surfaces 87 and 92 inclined along the lateral direction guide the conveyor surfaces 54.

FIG. 8 shows the support of the FOUP 64 for 300 mm wafers by the cell supports 80, 81. Positioning pins 94 associate with holes in the FOUP 64 for forklift trucks to perform positioning. Further, the positioning pins 94 do not come into contact with the FOUP 52 for 450 mm wafers, since they are accommodated in the V grooves 56.

Figure 9:
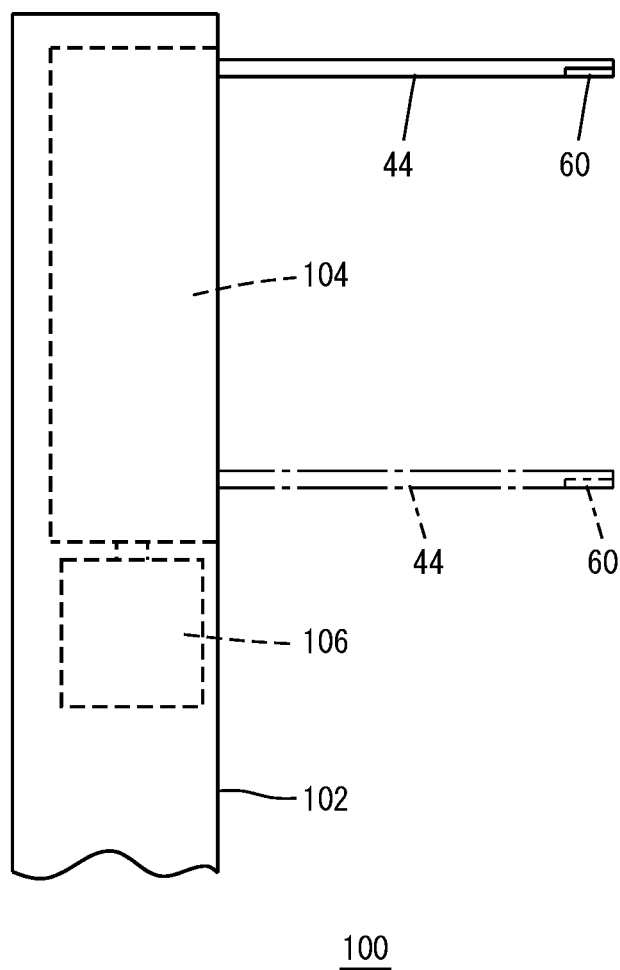
FIG. 9 is a side view of an anti-drop mechanism according to a comparative example.

FIG. 9 shows another anti-drop mechanism 100, according to a comparative example, for both the FOUPs 52 and 64. A sensor is provided to discriminate the species of the FOUPs 52, 64, or a host controller informs the species of the FOUPs 62, 64. Along a vertical pillar 102 standing from the arm 34, a direct motion mechanism, including a ball screw 104 and a motor 106, elevates and lowers the anti-drop member 44, according to the species of the FOUP 52, 64. In comparison with the present preferred embodiment, the comparative example needs more space for the direct motion mechanism, may generate particulates due to the direct motion mechanism, and has more portions which need maintenance.

In the present preferred embodiment, a SCARA arm 4 is preferably used, for example. However, the positioning guides 12, and the positioning protrusion 20, and the pins 22 may be provided on the top plate of a slide fork, and the pillar 48 and the anti-drop member 44, 46 may be provided on the middle plate of the fork.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A supporting arm for supporting a first article and a second article which is lower than the first article in height, the supporting arm comprising:
a supporting plate including a first positioning guide or protrusion that positions a bottom of the first article and inhibits horizontal movement of the first article, and a coupling pin that positions a bottom of the second article and inhibits horizontal movement of the second article, the first positioning guide or protrusion and the coupling pin positioning the first article and the second article, respectively, when lowered on the supporting plate and releasing the first article and the second article, respectively, from positioning when elevated;
a first anti-drop arm that advances over the first article when the first article is positioned by the first positioning guide or protrusion and prevents the first article from elevating and escaping from positioning; and
a second anti-drop arm that advances over the second article when the second article is positioned by the coupling pin and prevents the second article from elevating and escaping from positioning; wherein
the first positioning guide or protrusion is at a higher position than the coupling pin;
the first anti-drop arm and the second anti-drop arm are at a same side of the supporting plate in plan view;
the first positioning guide or protrusion and the coupling pin position one end of the first article that is on a side of the first anti-drop arm and the second anti-drop arm to be nearer or equally distant to the first anti-drop arm and the second anti-drop arm than one end of the second article that is on the side of the first anti-drop arm and the second anti-drop arm;
the second anti-drop arm retracts from the one end of the first article when the first positioning guide or protrusion positions the first article; and
the first anti-drop arm and the second anti-drop arm are separate from one another and do not directly contact each other.

2. A supporting arm according to claim 1, wherein
the second anti-drop arm advances over the second article and retracts from the one end of the first article when pushed by the first article;
the supporting arm further comprises a torsion spring that energizes the second anti-drop arm to advance over the second article.

3. A supporting arm according to claim 2, further comprising:
a moving arm that advances the supporting plate to an advanced position to transfer the first article and the second article to or from a cell support and retracts the supporting plate to a position of origin; wherein
the first anti-drop arm and the second anti-drop arm are both provided at the moving arm;
at the advanced position, the first anti-drop arm and the second anti-drop arm are both positionally separated from the first article and the second article; and
at the position of origin, the first anti-drop arm advances over the first article and the second article, and the second anti-drop arm advances only over the second article.

4. A supporting arm according to claim 1, wherein
the first anti-drop arm and the second anti-drop arm are attached to a common pillar at a higher position and at a lower position, respectively;
the second anti-drop arm is rotatably attached around a vertical shaft to the pillar.

5. A supporting arm according to claim 4 wherein the second anti-drop arm is provided with a roller that contacts the one end of the first article.

6. A supporting arm according to claim 5, further comprising a stopper that restricts a range of rotation of the second anti-drop arm to halt the second anti-drop arm at a position over the second article.

7. A supporting arm according to claim 1, further comprising:
a second positioning guide or protrusion; wherein
the coupling pin is located between the first positioning guide or protrusion and the second positioning guide or protrusion.

8. A supporting arm according to claim 1, wherein:
the second anti-drop arm is located at a lower height than an uppermost portion of the first article; and
the second anti-drop arm retracts to avoid a collision between the second anti-drop arm and the first article.

9. A supporting method performed by a supporting arm for supporting a first article and a second article which is lower than the first article in height, the method comprising:
positioning a bottom of the first article and inhibiting horizontal movement of the first article by a first positioning guide or protrusion of a supporting plate of the supporting arm and releasing the first article from positioning when the first article is elevated;
positioning a bottom of the second article and inhibiting horizontal movement of the second article by a coupling pin of the supporting plate of the supporting arm and releasing the second article from positioning when the second article is elevated;
advancing a first anti-drop arm over the first article when the first positioning guide or protrusion positions the first article to prevent the first article from elevating and being released from positioning; and
advancing a second anti-drop arm over the second article when the coupling pin positions the second article to prevent the second article from elevating and being released from positioning; wherein
the first positioning guide or protrusion is at a higher position than the coupling pin;
the first anti-drop arm and the second anti-drop arm are on a same side of the supporting plate in plan view;
the first positioning guide or protrusion and the coupling pin position one end of the first article that is on a side of the first anti-drop arm and the second anti-drop arm nearer or equally distant to the first anti-drop arm and the second anti-drop arm than one end of the second article that is on the side of the first anti-drop arm and the second anti-drop arm; and
retracting the second anti-drop arm from the one end of the first article when the first positioning guide or protrusion positions the first article.

* * * * *